(12) United States Patent
Okamoto et al.

(10) Patent No.: US 8,704,273 B2
(45) Date of Patent: Apr. 22, 2014

(54) SEMICONDUCTOR DEVICE AND METHOD FOR MANUFACTURING THE SAME, AND AMPLIFIER

(75) Inventors: Naoya Okamoto, Kawasaki (JP); Atsushi Yamada, Kawasaki (JP)

(73) Assignee: Fujitsu Limited, Kawasaki (JP)

(*) Notice: Subject to any disclaimer, the term of this patent is extended or adjusted under 35 U.S.C. 154(b) by 348 days.

(21) Appl. No.: 12/793,160

(22) Filed: Jun. 3, 2010

(65) Prior Publication Data

US 2010/0320505 A1   Dec. 23, 2010

(30) Foreign Application Priority Data

Jun. 17, 2009  (JP) ................................. 2009-144323

(51) Int. Cl.
   *H01L 29/778* (2006.01)

(52) U.S. Cl.
   USPC .............. 257/192; 257/194; 257/E29.246; 257/E21.403; 257/E29.004; 438/168; 438/172

(58) Field of Classification Search
   USPC .............. 257/192, 194, E29.246, E21.403, 257/E29.004; 438/172
   See application file for complete search history.

(56) References Cited

U.S. PATENT DOCUMENTS

| | | | |
|---|---|---|---|
| 2001/0025965 A1 | 10/2001 | Morizuka | |
| 2002/0117681 A1* | 8/2002 | Weeks et al. | 257/106 |
| 2004/0157355 A1 | 8/2004 | Kachi | |
| 2006/0108602 A1 | 5/2006 | Tanimoto | |
| 2007/0200143 A1* | 8/2007 | Saito et al. | 257/192 |
| 2007/0268071 A1* | 11/2007 | Pribble et al. | 330/251 |
| 2007/0278521 A1* | 12/2007 | Ishida et al. | 257/192 |
| 2009/0072243 A1* | 3/2009 | Suda et al. | 257/77 |

FOREIGN PATENT DOCUMENTS

| | | |
|---|---|---|
| JP | 2001-168111 A1 | 6/2001 |
| JP | 2001-284576 A1 | 10/2001 |
| JP | 2004-260140 A1 | 9/2004 |
| JP | 2006-173582 A1 | 6/2006 |
| JP | 2007-134608 A1 | 5/2007 |
| JP | 2007-329205 A1 | 12/2007 |
| JP | 2009-33097 A1 | 2/2009 |

OTHER PUBLICATIONS

Ambacher et al., "Two-dimensional electron gases induced by spontaneous and piezoelectric polarization charges in N- and Ga-face AlGaN/GaN heterostructures", Journal of Applied Physics, vol. 85, No. 6, Mar. 15, 1999, pp. 3222-3233.*

Grandjean, N et al., "Control of the polarity of GaN epilayers using a Mg adsorption layer", IEEE International Conference on Molecular Beam Epitaxy, San Francisco, CA, USA, Sep. 15-20, 2002, pp. 141-142.*

(Continued)

*Primary Examiner* — Steven Loke
*Assistant Examiner* — Sitaramarao S Yechuri
(74) *Attorney, Agent, or Firm* — Kratz, Quintos & Hanson, LLP

(57) ABSTRACT

A semiconductor device includes a nitride semiconductor layer having a (0001) face and a (000-1) face, formed above a common substrate; a (0001) face forming layer provided partially between the substrate and the nitride semiconductor layer; a source electrode, a drain electrode, and a gate electrode, provided on the nitride semiconductor layer having the (0001) face; and a hole extracting electrode provided on the nitride semiconductor layer having the (000-1) face.

19 Claims, 14 Drawing Sheets

(56) References Cited

OTHER PUBLICATIONS

Y.-L. Li, et al.; "Low-resistance ohmic contacts to p-type GaN;" Applied Physics Letters; vol. 76; No. 19; May 8, 2000; p. 2728-2730 (3 Sheets.)/p. 7 of specification.

O. Ambacher, et al.; "Two-dimensional electron gases induced by spontaneous and piezoelectric polarization charges in N- and Ga-face AlGaN/GaN heterostructures;" Journal of Applied Physics; vol. 85; No. 6; Mar. 15, 1999; pp. 3222-3233 (12 sheets.)/p. 12 of specification.

M. Park, et al.; "Micro-Raman study of electronic properties of inversion domains in GaN-based lateral polarity heterostructures;" Journal of Applied Physics; vol. 93; No. 12; Jun. 15, 2003; pp. 9542-9547 (6 Sheets.)/p. 9 of specification.

W.-C. Yang, et al.; "Photoelectron emission microscopy observation of inversion domain boundaries of GaN-based lateral polarity heterostructures;" Journal of Applied Physics; vol. 94; No. 9; Nov. 1, 2003; pp. 5720-5725. (6 Sheets.)/p. 12 of specification.

M. H. Wong, et al.; "Polarity inversion of N-face GaN by plasma-assisted molecular beam epitaxy;" Journal of Applied Physics; vol. 104; 2008; pp. 093710-1-093710-6 (6 Sheets.)/p. 19 of specification.

* cited by examiner

SEMICONDUCTOR DEVICE AND METHOD FOR MANUFACTURING THE SAME, AND AMPLIFIER

CROSS-REFERENCE TO RELATED APPLICATIONS

This application is based upon and claims the benefit of priority of the prior Japanese Patent Application No. 2009-144323, filed on Jun. 17, 2009, the entire contents of which are incorporated herein by reference.

FIELD

The embodiments discussed herein are related to a semiconductor device using a nitride semiconductor and a method for manufacturing the same, and an amplifier.

BACKGROUND

In view of their physical properties, GaN-based high electron mobility transistors (GaN-HEMTs) are expected, as high voltage devices capable of operating at a high speed, to be applied to millimeter-wave radar systems, systems for wireless base stations, server systems, for example.

However, when holes generated by impact ionization in a high electric field accumulate in an electron transit layer (channel), reduction in the breakdown voltage of the device, variation in the drain conductance characteristics due to the kink effect, and deterioration of the switching speed and so forth occur.

These issues can be effectively resolved by extracting holes generated by impact ionization from the channel.

There have been proposed three hole extracting structures, as depicted in FIGS. 14A-14C, for example.

There is a device structure having a p-type GaN layer, a GaN layer, and an AlGaN layer, as illustrated in FIG. 14A, wherein a source electrode, a drain electrode, and a gate electrode are formed on the AlGaN layer, and a hole extracting electrode is disposed on the back surface side of the device (first technique). This is the structure wherein holes are extracted from the back surface side via the p-type GaN layer. Additionally, there is a structure wherein a hole extracting electrode is disposed on the back surface side of the GaN layer, without providing a p-type GaN layer (second technique).

Furthermore, there is a device structure having a GaN layer and an AlGaN layer above a substrate, as illustrated in FIG. 14B, wherein a hole extracting electrode is provided on the GaN layer exposed by etching the layers to a depth deeper than the interface between the AlGaN layer and the GaN layer by, for example, dry etching and so forth (third technique). There is also a device structure having an AlGaN buffer layer between a substrate and a GaN layer (AlGaN/GaN/AlGaN device structure), wherein a hole extracting electrode is provided on the GaN layer exposed by etching the layers to a depth near the interface between the GaN layer and the AlGaN layer where two-dimensional hole gas (2DHG) is formed (fourth technique). In this case, the hole extracting electrode is provided on the GaN layer remained on the AlGaN layer.

Even further, there is a device structure having a GaN layer and an AlGaN layer on a substrate, as illustrated in FIG. 14C, wherein p-type impurities (such as magnesium (Mg), for example) are ion implanted, a rapid thermal anneal (RTA) is performed at a high temperature of 1000° C. or higher, and a hole extracting electrode is provided on the activated p-type region (fifth technique).

SUMMARY

According to an aspect of the embodiment, a semiconductor device includes nitride semiconductor layers having a (0001) surface and a (000-1) surface, formed above a same substrate; a (0001) surface forming layer provided partially between the substrate and the nitride semiconductor layer; a source electrode, a drain electrode, and a gate electrode provided on the nitride semiconductor layer having the (0001) surface; and a hole draining electrode formed on the nitride semiconductor layer having the (000-1) surface.

According to another aspect of the embodiment, an amplifier includes the semiconductor device set forth above.

According to a further aspect of the embodiment, a method for manufacturing a semiconductor device includes forming a nitride semiconductor layer having a (0001) face and a (000-1) face, above the substrate and the (0001) face forming layer; and forming a source electrode, a drain electrode, and a gate electrode, on the nitride semiconductor layer having the (0001) face, and forming a hole extracting electrode on the nitride semiconductor layer having the (000-1) face.

The object and advantages of the embodiment will be realized and attained by means of the elements and combinations particularly pointed out in the claims. It is to be understood that both the foregoing general description and the following detailed description are exemplary and explanatory and are not restrictive of the invention, as claimed.

BRIEF DESCRIPTION OF THE DRAWINGS

FIGS. 3A-3F are schematic diagrams illustrating the method for manufacturing the semiconductor device according to the first embodiment, wherein FIGS. 3A-3E are cross-sectional views and FIG. 3F is a plan view;

FIGS. 10A-10D are schematic diagrams illustrating a method for manufacturing a semiconductor device according to a forth embodiment, wherein FIGS. 10A-10C are cross-sectional views and FIG. 10D is a plan view;

FIGS. 11A-11D are schematic diagrams illustrating a method for manufacturing a semiconductor device according to a variant of a forth embodiment, wherein FIGS. 11A-11C are cross-sectional views and FIG. 11D is a plan view;

DESCRIPTION OF EMBODIMENTS

Figure 1:
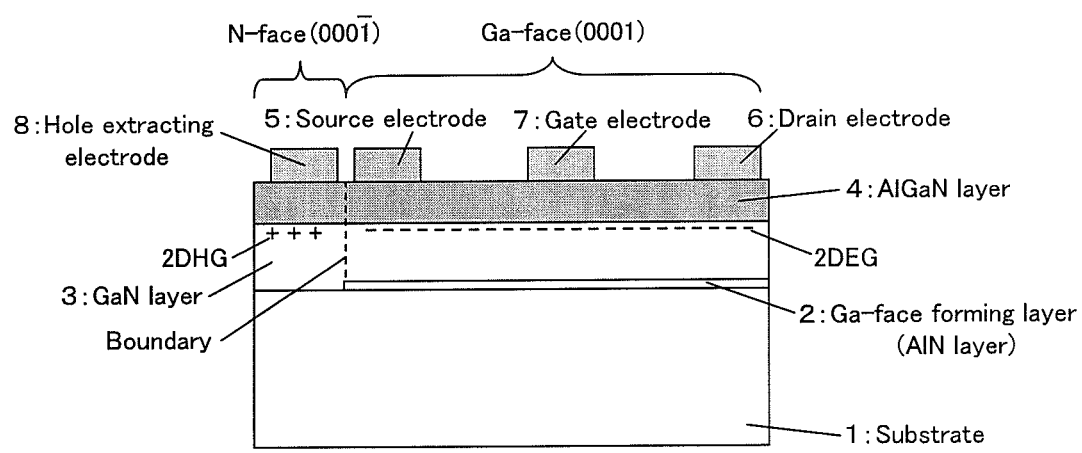
FIG. 1 is a schematic cross-sectional view illustrating the structure of a semiconductor device according to a first embodiment.

In the meantime, in the device structure according to the above-described first technique, since the p-type GaN layer (buffer layer) is conductive and has a capacitive component, the high-frequency characteristics are deteriorated as compared to a structure employing an insulating buffer layer.

With regard to above-described second technique, it requires complex processes and incurs additional processing steps since the substrate is separated from the nitride semiconductor device structure so as to expose the back surface side of the GaN layer and a flip-chip technique may be employed sometimes. Also with regard to above-described second technique, effective extraction of holes cannot be achieved since a hole extracting electrode is not provided on a p-type conductive layer and therefore the hole extracting electrode cannot maintain satisfactory ohmic characteristics.

With regard to above-described third technique, effective extraction of holes cannot be achieved since a hole extracting electrode is not provided on a p-type conductive layer, and therefore the hole extracting electrode cannot maintain satisfactory ohmic characteristics.

With regard to the above-described fourth technique, the contact resistivity may be significantly affected by the remaining thickness of the GaN layer, since the hole extracting electrode is provided on the GaN layer remained on the AlGaN buffer layer.

Y.-L. Li et al., "Low-resistance ohmic contacts to p-type GaN", Applied Physics Letters, Vol. 76, number 19, 8 May 2000, pp. 2728-2730, for example, discloses that a remaining thickness of approximately 30 Å of the GaN layer is required for establishing a sufficient contact resistivity, which requires a high-precision etching. Even when a highly controllable dry etching is performed, etching to remain such a significantly thin layer uniformly over the entire surface of the wafer is quite difficult, which makes satisfactory ohmic characteristics difficult to be achieved. Especially, etching control becomes even more difficult as getting deeper from the surface, which also makes satisfactory ohmic characteristics difficult to be achieved. Accordingly, effective extraction of holes becomes difficult.

With respect to the above-described fifth technique, the crystallinity is deteriorated, such as due to evaporation of an element from the nitride semiconductor during the RTA processing subsequent to the ion implant of the p-type impurities.

Accordingly, an effective extraction of holes in a semiconductor device that is capable of operating at a high speed and a high voltage is desired, without using any conductive buffer layer, without requiring any complex processes, without requiring any dry etching process with a significantly high depth precision, and without deteriorating the crystallinity.

Hereinafter, semiconductor devices according to embodiments and methods for manufacturing the same, and an amplifier will be described with reference to the drawings.

[First Embodiment]

A semiconductor device according to a first embodiment and a method for manufacturing the same will be described with reference to FIGS. 1-4.

The semiconductor device according to this embodiment is a semiconductor device using a nitride semiconductor, which is capable of operating at a high speed and a high voltage, and may be a gallium nitride (GaN)-based high electron mobility transistor (GaN-HEMT; electronic device; power device), for example.

This semiconductor device has a device structure having a substrate 1, an aluminum nitride (AlN) nucleation layer 2 formed partially on the substrate 1, a GaN layer 3 formed entirely above the substrate 1 and the AlN nucleation layer 2, and an AlGaN layer 4 formed entirely on the GaN layer 3, as illustrated in FIG. 1. Note that the substrate 1 is a C-face sapphire substrate, in this example. The GaN layer 3 is an undoped GaN layer (electron transit layer; channel layer; buffer layer), and the AlGaN layer 4 is an n-type AlGaN layer (electron supplying layer; barrier layer), for example.

In this embodiment, after forming the AlN nucleation layer 2 partially on the C-face sapphire substrate 1, the GaN layer 3 and the AlGaN layer 4 are grown, in this sequence, as nitride semiconductor layers (GaN-based semiconductor layers; nitride semiconductor layers containing a group III element).

As a result, the surface of the GaN layer 3 directly grown on the C-face sapphire substrate 1 is an N-face (N polarity face having N element on this surface), and the surface of the GaN layer 3 grown on the AlN nucleation layer 2 is a Ga-face (Ga polarity face having Ga element on this surface). In other words, the GaN layer 3 having an N-face and a Ga-face on the same plane can be grown. Refer to, for example, M. Park et al., "Micro-Raman study of electronic properties of inversion domains in GaN-based lateral polarity heterostructures", Journal of Applied Physics, Vol. 93, No. 12, 15 Jun. 2003, pp. 9542-9547, the entire content of which is incorporated herein by reference.

The surface of the AlGaN layer 4 grown on the GaN layer 3 having the N-face is an N-face, and the surface of the AlGaN layer 4 grown on the GaN layer 3 having the Ga-face is a Ga-face. In other words, the AlGaN layer 4 having an N-face and a Ga-face on the same plane can be grown.

In this embodiment, the N-face is a crystalline plane having a plane orientation of (000-1), i.e., a (000-1) face. The Ga-face is a crystalline plane having a plane orientation of (0001), i.e., a (0001) face.

Thus, the GaN layer 3 and the AlGaN layer 4 have the (0001) face and the (000-1) face on the same plane. More specifically, the AlGaN layer 4 is a nitride semiconductor layer that is formed on the common substrate, and has the (0001) face and the (000-1) face (first nitride semiconductor layer; GaN-based semiconductor layer). The GaN layer 3 contacting the bottom of the AlGaN layer 4 is a nitride semiconductor layer that is formed on the common substrate, and has the (0001) face and the (000-1) face (second nitride semiconductor layer; GaN-based semiconductor layer).

As set forth above, since the AlN nucleation layer 2 is used for forming the (0001) face (Ga-face) on the surfaces of the nitride semiconductor layers (GaN-based semiconductor layers) 3 and 4 formed on the C-face sapphire substrate 1, this layer is also referred to as a "(0001) face forming layer (Ga-face forming layer)". Note that the (0001) face forming layer (Ga-face forming layer) 2 may be provided partially between the substrate 1 and the nitride semiconductor layers (GaN-based semiconductor layers) 3 and 4. More specifically, the (0001) face forming layer (Ga-face forming layer) 2 may be provided between the substrate 1 and the nitride semiconductor layers 3 and 4, and may be formed in the region that is smaller than the region in which the nitride semiconductor layers (GaN-based semiconductor layers) 3 and 4 are to be formed.

In this semiconductor device, a source electrode 5, a drain electrode 6, and a gate electrode 7 are further provided in the Ga-face region (Ga-face grow region) of the nitride semiconductor layers (GaN-based semiconductor layers) 3 and 4. More specifically, the source electrode 5, the drain electrode 6, and the gate electrode 7 are provided on the AlGaN layer 4 having the Ga-face.

In this semiconductor device, a hole extracting electrode 8 is provided in the N-face region (N-face grow region) of the nitride semiconductor layers (GaN-based semiconductor layers) 3 and 4. More specifically, the hole extracting electrode 8 is provided on the AlGaN layer 4 having the N-face.

For example, in the N-face region, i.e., in the N-face growing GaN layer/AlGaN layer, the hole extracting electrode 8 may be formed from a metal having a higher work function (approximately 5 eV or greater), such as nickel (Ni). This enables better ohmic characteristics with respect to holes at an anneal temperature (for example approximately 400° C.) significantly lower than an RTA temperature used for activating ion-implanted p-type impurities.

The reasons of providing the source electrode 5, the drain electrode 6, and the gate electrode 7 in the Ga-face region and providing the hole extracting electrode 8 in the N-face region are as follows.

More specifically, in the Ga-face region of the stacked nitride semiconductor layers (GaN-based semiconductor layers) 3 and 4, two-dimensional electron gas (2DEG) is formed by the spontaneous polarization and the piezo polarization at the nitride semiconductor layer interface (AlGaN/GaN interface, in this embodiment). In contrast, two-dimensional hole gas (2DHG) tend to be formed at the nitride semiconductor layer interface (AlGaN/GaN interface, in this embodiment) in the N-face region, due to the opposing polarization. Refer to, for example, O. Ambacher et al. "Two-dimensional electron gases induced by spontaneous and piezoelectric polarization charges in N- and Ga-face AlGaN/GaN heterostructures", JOURNAL OF APPLIED PHYSICS, Vol. 85, No. 6, 15 Mar. 1999, pp. 3222-3233, the entire content of which is incorporated by reference.

In addition, since the width of the boundary region between the Ga-face region and the N-face region is about 400 nm (0.4 µm), which is equivalent to the distance between the gate and the source, holes generated by impact ionization easily diffuse from the channel to N-face region and accumulate in the nitride semiconductor layer interface of the N-face region (N-face growing AlGaN/GaN interface, in this embodiment). Refer to, for example, W.-C. Yang et al., "Photoelectron emission microscopy observation of inversion domain boundaries of GaN-based lateral polarity heterostructures", JOURNAL OF APPLIED PHYSICS, Vol. 94, No. 9, 1 Nov. 2003, pp. 5720-5725, the entire content of which is incorporated by reference.

Accordingly, the source electrode 5, the drain electrode 6, and the gate electrode 7 are provided in the Ga-face region, the hole extracting electrode 8 is provided in the N-face region, as set forth previously.

Hereinafter, a method for manufacturing the semiconductor device according to this embodiment (GaN-HEMT) will be explained with reference to FIGS. 1-3F.

In this method for manufacturing the semiconductor device, a Ga-face forming layer, i.e., a (0001) face forming layer (AlN nucleation layer, in this embodiment) 2 is partially formed above the substrate 1, as illustrated in FIG. 1. Nitride semiconductor layers (GaN layer 3 and AlGaN layer 4, in this embodiment) having a (0001) face and a (000-1) face are then formed above the substrate 1 and the (0001) face forming layer 2. Thereafter, the source electrode 5, the drain electrode 6, and the gate electrode 7 are formed on the nitride semiconductor layer having the (0001) face (the AlGaN layer 4, in this embodiment), and the hole extracting electrode 8 is formed on the nitride semiconductor layer having the (000-1) face (the AlGaN layer 4, in this embodiment).

Hereinafter, these processes will be explained in more detail.

Figure 2A:
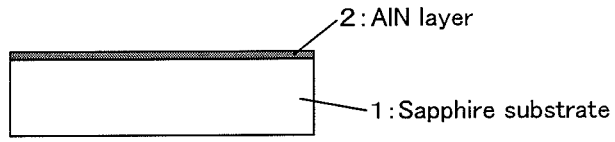
FIGS. 2A-2F are schematic cross-sectional views illustrating a method for manufacturing the semiconductor device according to the first embodiment.

As illustrated in FIG. 2A, an AlN nucleation layer 2 having a thickness of approximately 25 nm is grown (deposited) on the C-face sapphire substrate 1 at a substrate temperature of approximately 720° C. by plasma-assisted molecular beam epitaxy (PAMBE), for example.

Figure 2B:
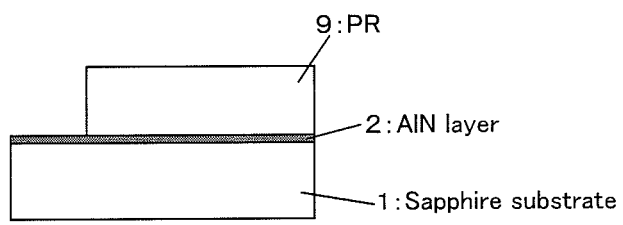

Subsequently, as illustrated in FIG. 2B, a photoresist (PR) 9 is patterned to cover the region (Ga-face region) in which nitride semiconductor layers having a Ga-face (GaN layer 3 and AlGaN layer 4, in this embodiment) are to be grown.

Figure 2C:
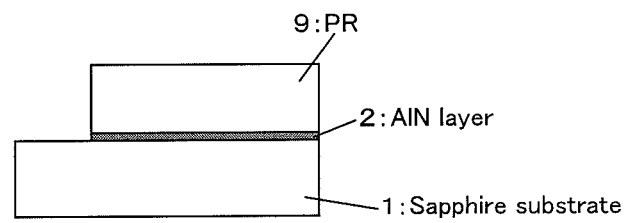

As illustrated in FIG. 2C, using this resist pattern, a portion of the AlN nucleation layer 2, above which a nitride semiconductor layers having an N-face (GaN layer 3 and AlGaN layer 4, in this embodiment) are to be grown, is removed using a wet etching using KOH, a chlorine-based dry etching, or argon ion milling, for example.

Figure 2D:
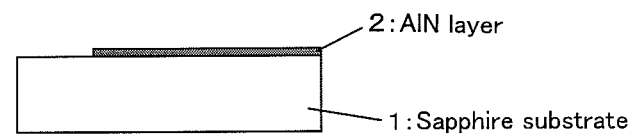

The resist 9 is removed, as illustrated in FIG. 2D. As a result, an AlN nucleation layer 2 is left partially on the C-face sapphire substrate.

Figure 2E:
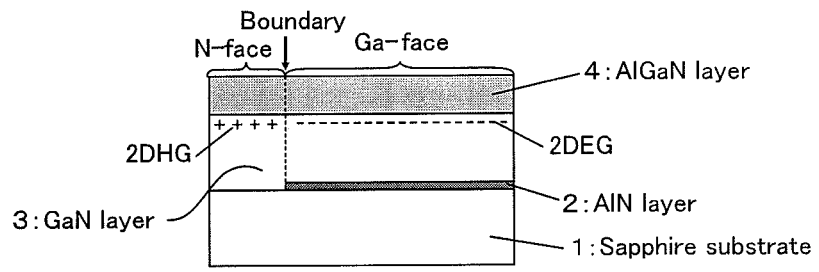

Subsequently, as illustrated in FIG. 2E, a GaN layer 3 (approximately 1 µm thick) and an AlGaN layer 4 (approximately 25 nm thick) having an Al composition of about 20% are sequentially grown above the resultant wafer at a substrate temperature of approximately 720° C. by PAMBE, for example.

In this case, the GaN layer 3 and the AlGaN layer 4 directly grown on the C-face sapphire substrate 1 (region without the AlN nucleation layer 2) are the GaN layer 3 having an N-face surface and the AlGaN layer 4 having an N-face surface, respectively, while the GaN layer 3 and the AlGaN layer 4 grown on the AlN nucleation layer 2 are the GaN layer 3 having a Ga-face surface and the AlGaN layer 4 having a Ga-face surface, respectively. That is, a nitride semiconductor layers (GaN layer 3 and AlGaN layer 4, in this embodiment) having the N-face and the Ga-face on the same plane are formed. Thus, 2DEG is formed at the AlGaN/GaN interface of the Ga-face growing region growing the GaN layer 3 and the AlGaN layer 4 having the Ga-face, while 2DHG is formed at the AlGaN/GaN interface of the N-face growing region growing the GaN layer 3 and the AlGaN layer 4 having the N-face.

The thus prepared wafer is processed to fabricate devices.

Figure 2F:
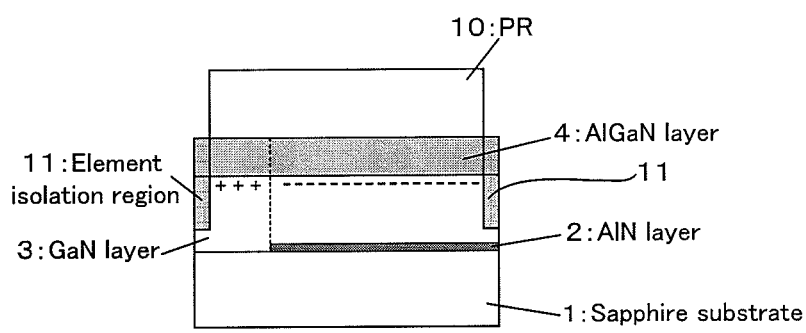

As illustrated in FIG. 2F, after a resist 10 is photolithographically patterned to cover the region other than the region in which an element isolation region is to be formed, i.e., the active region, ions, such as boron, are implanted to define element isolation regions 11. Note that the element isolation may also be achieved by forming a mesa structure by chlorine-based dry etching, for example.

Figure 3A:
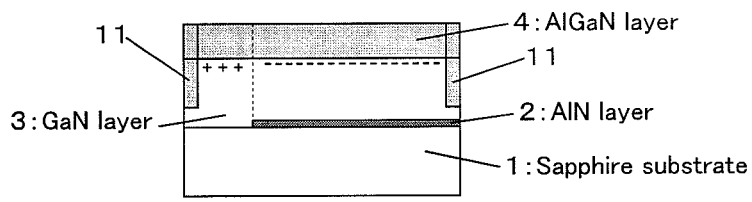
Figure 3B:
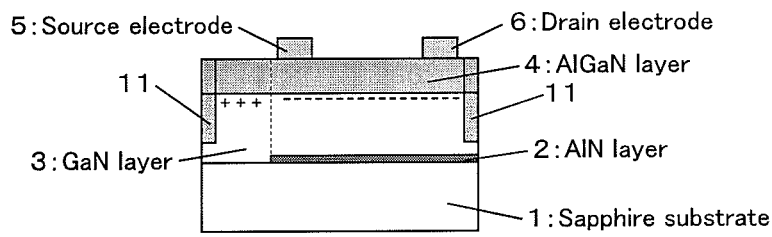

Subsequently, after removing the resist 10 as illustrated in FIG. 3A, a source electrode 5 and a drain electrode 6, both made from Ti/Al, are formed simultaneously on the AlGaN layer 4 having the Ga-face, by photolithography, and evaporation and lift-off, for example, as illustrated in FIG. 3B. A rapid thermal anneal (RTA) is carried out at approximately 600° C., for example, to establish an ohmic contact.

Figure 3C:
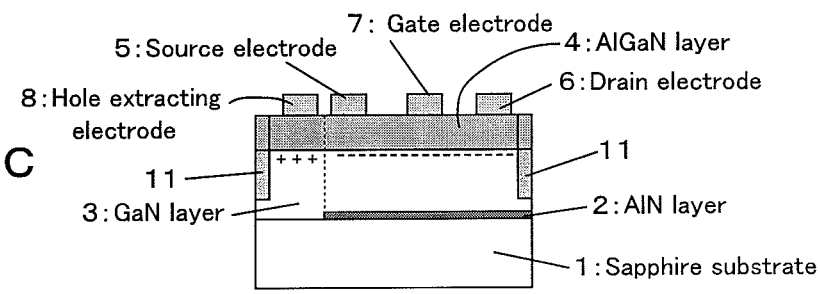

After photolithographic patterning, for example, as illustrated in FIG. 3C, a gate electrode 7 made of Ni/Au, and a hole extracting electrode 8 made of Ni/Au are formed simultaneously on the AlGaN layer 4 having the Ga-face and on the AlGaN layer 4 having the N-face, respectively, by evaporation and lift-off.

Nickel, which has a greater work function (approximately 5.15 eV), forms a Schottky barrier with respect to the AlGaN layer 4 having the Ga-face while exhibiting the ohmic characteristics with respect to the AlGaN layer 4 having the N-face. This property of nickel is utilized for simultaneously forming the gate electrode 7 and the hole extracting electrode 8 from the same material. Note that an anneal at approximately 400° C., for example, may be carried out for about 5 minutes in order to further improve the ohmic characteristics. Any metal that can provide better ohmic characteristics for holes may be used, or ITO may be used, for example.

Figure 3D:
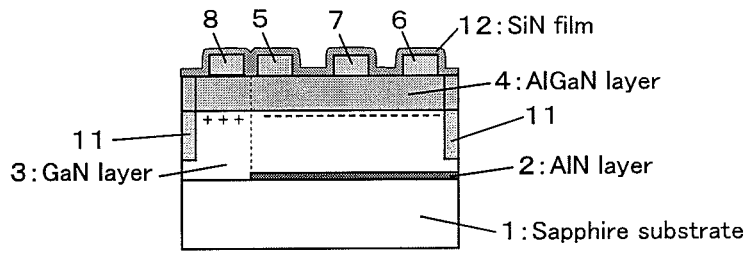
Figure 3E:
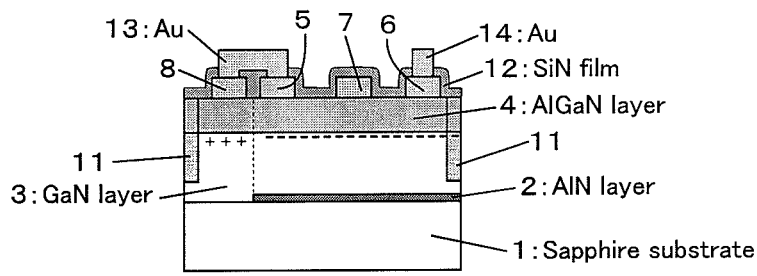
Figure 3F:
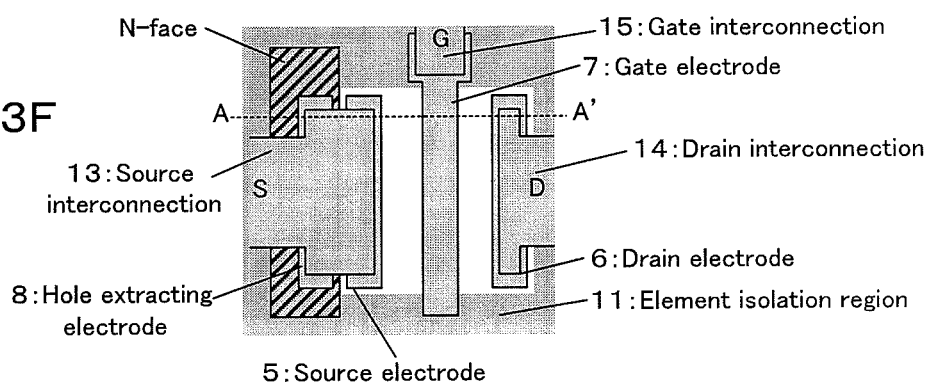

Finally, a passivation is provided by an SiN film (insulation film) 12, which may be formed by plasma enhanced chemical vapor deposition (PCVD), for example, as illustrated in FIG. 3D. After removing a part of the SiN film 12 in the contact regions by dry etching, as illustrated in FIGS. 3E and 3F, the source electrode 5 and the hole extracting electrode 8 are connected through interconnection (source interconnection) 13 made of plated Au. Note that FIG. 3E is a cross-sectional view along Line A-A' in FIG. 3F.

Although the hole extracting electrode 8 is illustrated to be connected to the source electrode 5, this is not limiting and the hole extracting electrode 8 may be grounded, bypassing the source electrode 5, for example. Simultaneously with the source interconnection 13, drain interconnection 14 and gate interconnection 15 are also formed by Au plating.

Thus, the holes, which are generated by impact ionization and diffuse from the channel to N-face growing region, thereby accumulating at N-face growing AlGaN/GaN interface, can be effectively extracted through the hole extracting electrode 8 connected to the source electrode 5.

The semiconductor device according to this embodiment (GaN-HEMT) may be fabricated in the manner set forth above.

Accordingly, the semiconductor device and the method for manufacturing the same according to this embodiment provide advantages in that holes generated by impact ionization can be effectively extracted in a semiconductor device capable of operating at a high speed and a high voltage, without using any conductive buffer layer, without requiring any complex processes, without requiring any dry etching process with a significantly high depth precision, and without deteriorating the crystallinity.

Furthermore, systems employing a semiconductor device having the hole extracting electrode structure according to this embodiment, such as millimeter-wave radar systems, systems for wireless base stations, server systems, may be constructed as further reliable systems.

Although, in the above-described embodiment, the nitride semiconductor layers 3 and 4 having the Ga-face and the N-face are formed above the common substrate 1 by providing the AlN nucleation layer 2 on the substrate (C-face sapphire substrate) 1, above which a nitride semiconductor layers having an N-face are to be grown, this is not limiting. The present invention can be widely applied to any semiconductor devices having a nitride semiconductor layers formed above a common substrate and having a Ga-face and an N-face.

Figure 4:
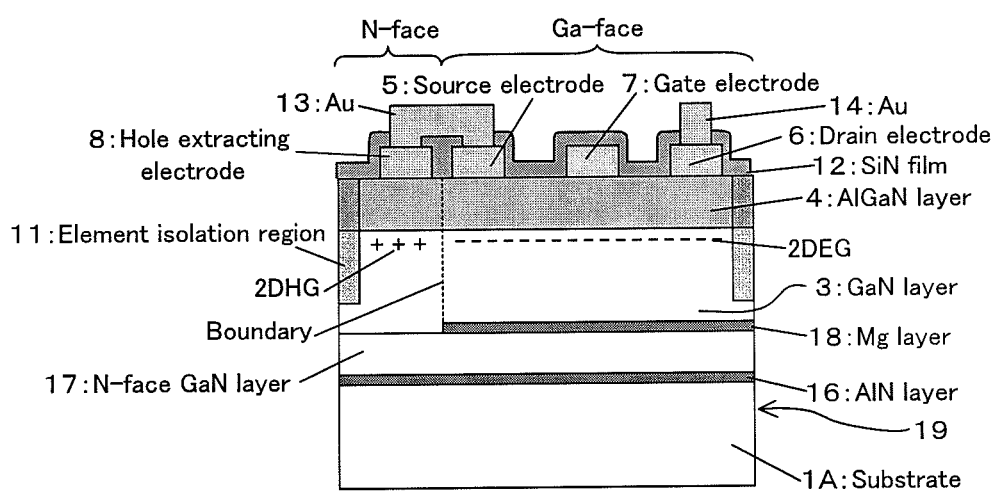
FIG. 4 is a schematic cross-sectional view illustrating the structure of a semiconductor device according to a variant of the first embodiment.

For example, as illustrated in FIG. 4, the nitride semiconductor layers 3 and 4 having the Ga-face and the N-face may be formed above a common substrate 1A using a so-called template substrate 19, which includes the substrate 1A, an AlN nucleation layer 16 formed entirely on the substrate 1A, and a GaN layer 17 formed entirely on AlN nucleation layer 16 (N-face grown GaN layer).

For such a template substrate 19, a carbon(C)-face SiC substrate, an N-face GaN substrate, an N-face AlN substrate, and the like may be used as the based substrate 1A. Among them, a SiC substrate and an AlN substrate can provide a nitride semiconductor crystal with reduced lattice defects or the like, since they have lattice constants closer to that of GaN compared to sapphire, and exhibit higher thermal conductivities by a factor of ten. On the other hand, a GaN substrate having the same lattice constant can further reduce lattice defects, although its thermal conductivity is not comparable to those of SiC and AlN.

When employing such a template substrate 19, an Mg layer 18 may be formed by depositing (irradiating) Mg partially on the N-face grown GaN layer 17 (GaN layer having an N-face; fourth nitride semiconductor layer), thereby partially inverting polarity from the N-face to the Ga-face. Refer to, for example, M. H. Wong et al., "Polarity inversion of N-face GaN by plasma-assisted molecular beam epitaxy", JOURNAL OF APPLIED PHYSICS, Vol. 104, 093710, (2008), the entire content of which is incorporated by reference.

The device structure is thus obtained, including the template substrate 19, the Mg layer 18 formed partially on the template substrate 19 (i.e., the N-face grown GaN layer 17), the GaN layer 3 formed entirely on the N-face grown GaN layer 17 and the Mg layer 18, and the AlGaN layer 4 formed entirely on the GaN layer 3. Note that other elements may be configured similar to the above-described embodiment.

In this device structure, whether the surfaces of the nitride semiconductor layers 3 and 4 is a Ga-face or an N-face may be determined by presence or absence of the Mg layer 18. In this example, the surface of the GaN layer 3 directly grown on the N-face grown GaN layer 17 is an N-face while the surface of the GaN layer 3 grown on the Mg layer 18 is a Ga-face. In other words, the GaN layer 3 having the N-face and the Ga-face on the same plane can be grown. The surface of the AlGaN layer 4 grown on the GaN layer 3 having the N-face is an N-face, and the surface of the AlGaN layer 4 grown on the GaN layer 3 having the Ga-face is a Ga-face. In other words, the AlGaN layer 4 having an N-face and a Ga-face on the same plane can be grown.

As set forth above, since the Mg layer 18 is used for forming the (0001) face (Ga-face) on the surfaces of the nitride semiconductor layers (GaN-based semiconductor layer) 3 and 4 formed on the substrate 1A, this layer is also referred to as a "(0001) face forming layer (Ga-face forming layer)". Note that the (0001) face forming layer (Ga-face forming layer) 18 may be provided partially between the substrate 1 and the nitride semiconductor layers (GaN-based semiconductor layers) 3 and 4. More specifically, the (0001) face forming layer (Ga-surface forming layer) 18 may be provided between the substrate 1 and the nitride semiconductor layers 3 and 4, and may be formed in the region that is smaller than the region in which the nitride semiconductor layers (GaN-based semiconductor layers) 3 and 4 are formed.

As set forth above, the substrate used for the semiconductor device according to this embodiment may be one of a sapphire substrate, a silicon carbide substrate, a gallium nitride substrate, and an aluminum nitride substrate. Note that an insulating substrate may be used as the substrate, and a conductive substrate, for example, a template substrate providing a thick N-face grown GaN layer may be used as the substrate.

[Second Embodiment]

A semiconductor device and a method for manufacturing the same, and an amplifier according to a second embodiment will be explained with reference to FIGS. 5A-5F and 6.

This embodiment will be described with reference to an example wherein the present invention is applied to a GaN-HEMT having an AlGaN layer (barrier layer) having a higher Al composition.

As used herein the term "AlGaN layer having a higher Al composition" means an AlGaN layer having an Al composition of about 25% or higher, or an AlGaN layer having an Al composition of no less than 25% and no more than 35%, for example.

For example, for a GaN-HEMT for a millimeter wave amplifier (GaN-HEMT used in a high-frequency amplifier), an Al composition of about 30% of an AlGaN barrier layer of about 20 nm thick can increase the concentration of 2DEG induced by piezo polarization, thereby increasing the current density.

In contrast, the ohmic characteristics are deteriorated due to an increased band discontinuity and reduced tunnel effect. This becomes significant due to higher effective masses of holes than electrons.

Accordingly, in order to form a hole extracting electrode closer to the N-face growing AlGaN/GaN interface, a recess is formed in the region in which a hole extracting electrode is to be provided, and a hole extracting electrode is formed in the recess.

Figure 5:
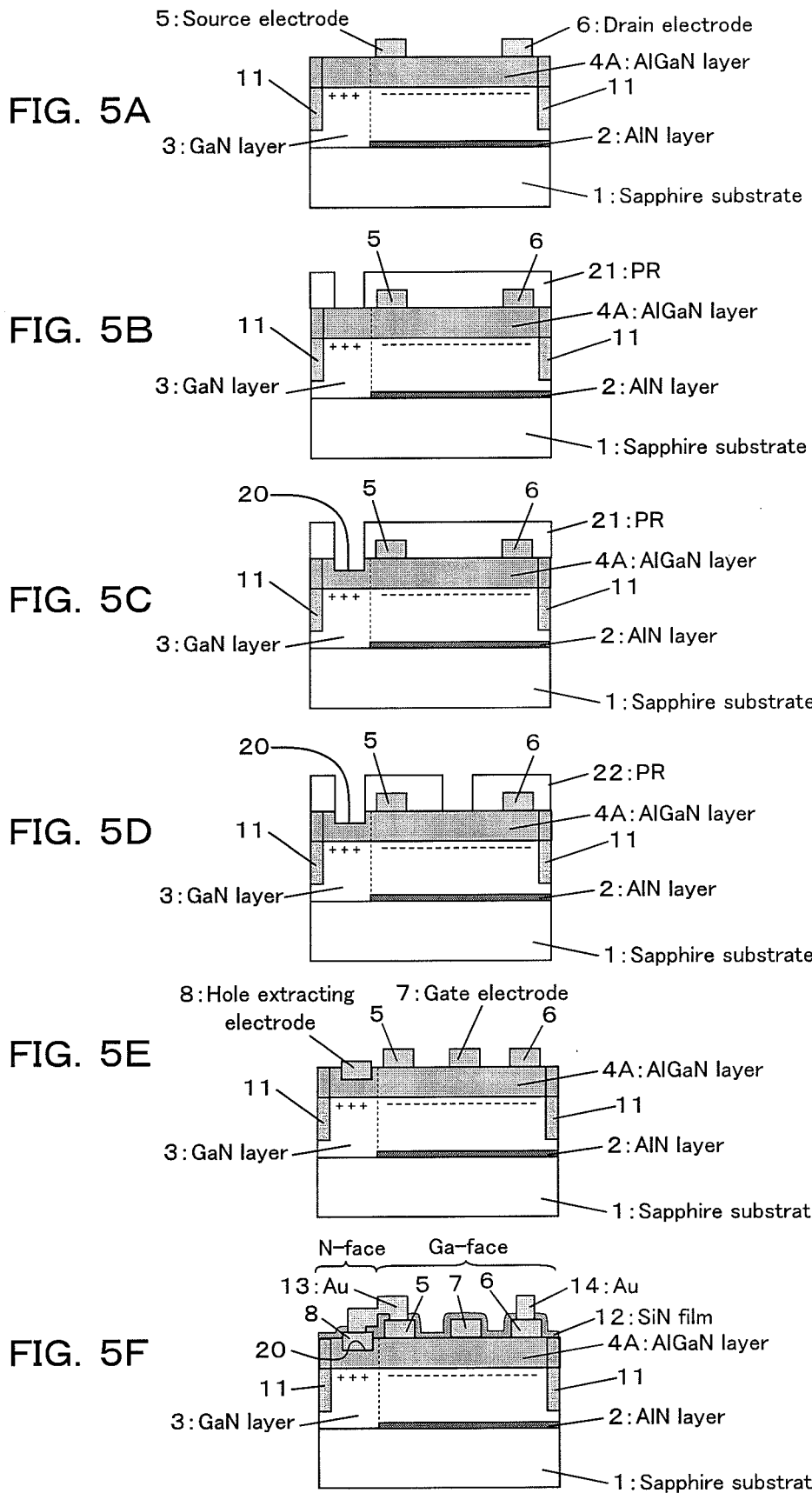
FIGS. 5A-5F are schematic cross-sectional views illustrating a method for manufacturing a semiconductor device according to a second embodiment.

Thus, this embodiment differs from the above-described first embodiment (see FIG. 1) in that an AlGaN layer (barrier layer) 4A having a higher Al composition is disposed, and a recess 20 is formed in the region in which the hole extracting electrode 8 is to be provided and the hole extracting electrode 8 is formed in the recess 20, as illustrated in FIG. 5F. The same elements in FIGS. 5A-5F as in the above-described first embodiment (see FIG. 1, for example) are referenced by the like reference symbols.

In this embodiment, a hole extracting electrode is provided in a region (recess) partially thinned in a nitride semiconductor layer having an N-face, i.e., (000-1) face (AlGaN layer, in this example). Again, the hole extracting electrode is provided on a nitride semiconductor layer having an N-face, i.e., (000-1) face (AlGaN layer, in this example).

The details of other elements are similar to those in the above-described first embodiment, and descriptions thereof will be omitted.

Hereinafter, a method for manufacturing the semiconductor device according to this embodiment (GaN-HEMT) will be explained with reference to FIGS. 5A-5F and 6.

After the processes similar to those in the above-described first embodiment (see FIGS. 2A-2F and 3A), the source electrode 5 and the drain electrode 6 are formed, as illustrated in FIG. 5A, in the manner similar to the above-described first embodiment (see FIG. 3B).

After applying a resist (PR) 21, as illustrated in FIG. 5B, a region in which the hole extracting electrode 8 is to be provided is opened by photolithography, for example.

Subsequently, as illustrated in FIG. 5C, a recess 20 is formed by etching the AlGaN layer 4A to a predetermined depth through the opening region in the resist 21, by chlorine-based dry etching, for example.

After removing the resist 21, as illustrated in FIG. 5D, a resist 22 is applied again and a region in which a gate electrode 7 and a hole extracting electrode 8 are to be formed is opened by photolithography, for example.

The gate electrode 7 and the hole extracting electrode 8, both made of Ni/Au, are then formed by evaporation and lift-off, as illustrated in FIG. 5E. At this time, the hole extracting electrode 8 is formed in the recess 20 formed in the AlGaN layer 4A.

Finally, a passivation is provided by an SiN layer (insulation layer) 12, which may be formed by plasma enhanced CVD or the like. After removing the SiN film 12 in the contact regions by dry etching, the source electrode 5 and the hole extracting electrode 8 are connected through interconnection (source interconnection) 13 made of plated Au.

The semiconductor device according to this embodiment (GaN-HEMT) may be fabricated in the manner set forth above.

The details of other steps in the fabrication method are similar to those in the above-described first embodiment, and descriptions thereof will be omitted.

Thus, the semiconductor device and the method for manufacturing the same according to this embodiment provide advantages in that holes generated by impact ionization can be effectively extracted in a semiconductor device capable of operating at a high speed and a high voltage, without using any conductive buffer layer, without requiring any complex processes, without requiring any dry etching process with a significantly high depth precision, and without deteriorating the crystallinity.

Especially in this embodiment, the hole extracting electrode 8 is formed in a thickness-reduced part (recess 20) in the AlGaN layer 4A, thus located closer to the N-face growing AlGaN/GaN interface. For this reason, holes generated by impact ionization can also be effectively extracted in a GaN-HEMT structure having an AlGaN barrier layer 4A of higher Al composition.

Furthermore, systems employing a semiconductor device having the hole extracting electrode structure according to this embodiment, such as millimeter-wave radar systems, may be constructed as further reliable systems.

Although the recess 20 is formed by partially etching the nitride semiconductor layer having an N-face, i.e., (000-1) face (AlGaN layer 4A) and the hole extracting electrode 8 is provided in the recess 20, this is not limiting.

Figure 6:
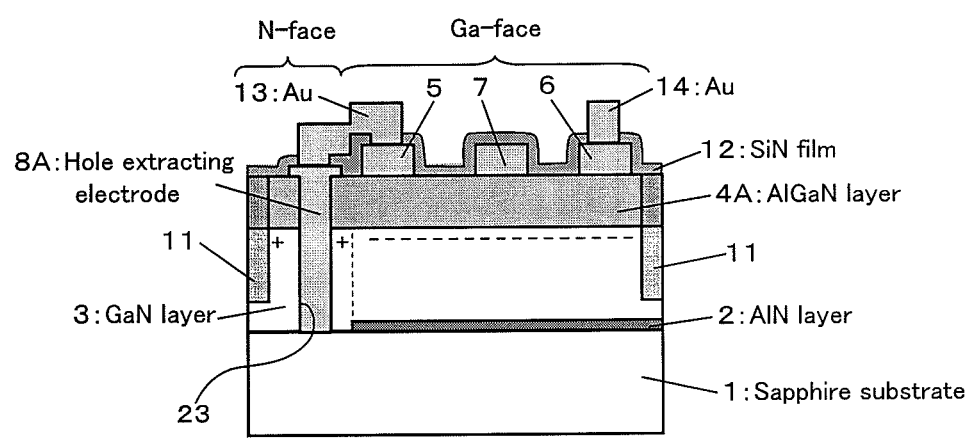
FIG. 6 is a schematic cross-sectional view illustrating the structure of a semiconductor device according to a variant of the second embodiment.

For example, as illustrated in FIG. 6, the region in which the hole extracting electrode 8A is to be formed may be formed as a trench 23 (etched trench) extending to a depth deeper than the AlGaN/GaN interface, e.g., to the interface with the sapphire substrate 1, and the hole extracting electrode 8A may be formed in the trench 23, for example. For example, the hole extracting electrode 8A made of Ni/Au may be formed at least on the side wall of the trench 23. The same elements in FIG. 6 as in the above-described embodiment (see FIG. 5F, for example) are referenced by the like reference symbols.

In this case, the hole extracting electrode 8A provided on a first nitride semiconductor layer having a (000-1) face (AlGaN layer 4A) extends from the top surface of the first nitride semiconductor layer 4A to a depth deeper than the interface between the first nitride semiconductor layer 4A and the second nitride semiconductor layer (GaN layer 3), e.g., to the sapphire substrate 1, for example.

Since the hole extracting electrode 8A can be directly connected to the 2DHG bypassing an AlGaN barrier layer 4A, the ohmic characteristics are improved and holes thus can be effectively extracted.

Such a device structure is advantageous in a GaN-HEMT including an AlGaN barrier layer 4A having an even higher Al composition, such as an Al composition of over 40%, for example.

In the meantime, in above-described embodiments, increasing the transconductance and reducing the on-resistance are effective in improving the device characteristics.

The transconductance and the on-resistance are, however, contradictory in terms of the thickness of the AlGaN barrier layer 4A. More specifically, an improved transconductance is obtained by reducing the thickness of the AlGaN barrier layer 4A while the AlGaN barrier layer 4A is required to be thicker in order to reduce the on-resistance, i.e., the sheet resistance of the epitaxial layer.

Figure 7:
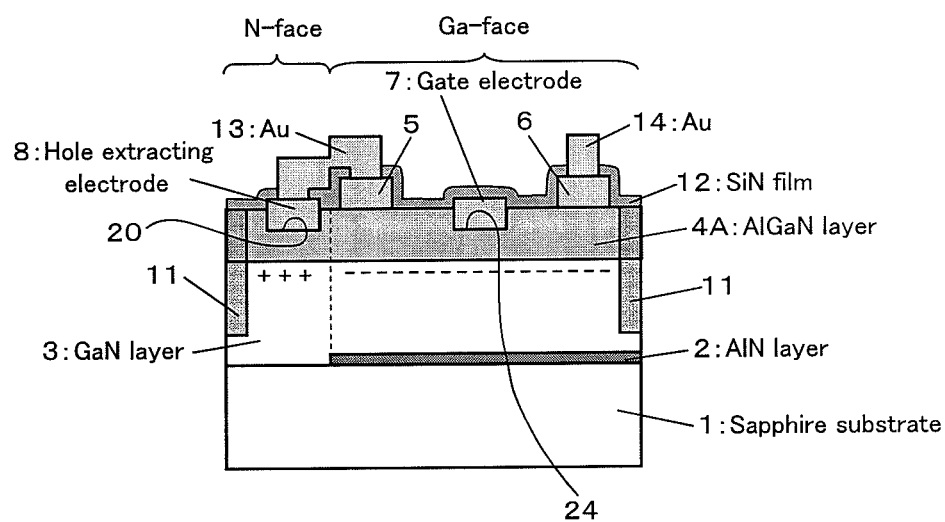
FIG. 7 is a schematic cross-sectional view illustrating the structure of a semiconductor device according to another variant of the second embodiment.

For this purpose, as illustrated in FIG. 7, for example, a recess (gate recess) 24 may be formed in the gate electrode formation region simultaneously with formation of the recess 20 in the hole extracting electrode formation region, and the gate electrode 7 made of Ni/Au may be formed in the gate recess 24 (on the etched surface). The same elements in FIG. 7 as in the above-described embodiment (see FIG. 5F, for example) are referenced by the like reference symbols.

More specifically, the gate electrode 7 may be formed in a region (gate recess 24) partially thinned in a nitride semiconductor layer having a Ga-face, i.e., (0001) face (AlGaN layer 4A). Again, the gate electrode 7 is provided on a nitride semiconductor layer having a Ga-face, i.e., (0001) face (AlGaN layer 4A, in this example).

This can improve the transconductance and on-resistance, and holes can be effectively extracted. In addition, since the gate recess 24 and the recess 20 in the hole extracting electrode formation region are simultaneously formed by etching, no additional process step is required.

Although the above-described embodiment has been described as being applied to the variant of the first embodiment (see FIG. 1), this embodiment may be applied to the variant of the first embodiment (see FIG. 4).

Although the above-described embodiment has been described with reference to the example wherein the present invention is applied to a GaN-HEMT having the AlGaN layer (barrier layer) 4A having a higher Al composition, this is not limiting. For example, the configuration of the above-described embodiment may be applied to a device structure of the above-described first embodiment, i.e., a GaN-HEMT having an AlGaN layer 4 with a non-limiting Al composition. For example, the configuration of the above-described embodiment maybe applied to a GaN-HEMT having an AlGaN layer 4 with a lower Al composition (for example, an Al composition of lower than the range of no less than about 15% and no more than about 25%).

[Third Embodiment]

A semiconductor device and a method for manufacturing the same, and an amplifier according to a third embodiment will be explained with reference to FIGS. 8A-8F, 9A, and 9B.

This embodiment will be described with reference to an example wherein the present invention is applied to a GaN-HEMT having a GaN cap layer on an AlGaN layer (barrier layer).

For example, a GaN-HEMT (high-power device; GaN-HEMT used in a high-power amplifier) used for a wireless base station or the like employs an n-type conductive GaN layer (cap layer) in order to reduce the current collapse.

In addition, a GaN-HEMT (power device) used for a switching power supply device of a server or the like, for example, a p-type conductive GaN layer (cap layer) or the like is used for achieving a normally-off operation wherein no current flows during stand-by.

In such cases, the Schottky barrier characteristics with respect to electrons are increased due to the negative fixed charges induced at the interface of a Ga-face growing GaN cap layer/AlGaN barrier layer.

For this reason, a GaN cap layer is removed in the source electrode formation region and the drain electrode formation region to form a recess.

Similarly, the Schottky barrier characteristics with respect to holes are increased due to the positive fixed charges induced at the interface of a N-face growing GaN cap layer/AlGaN barrier layer.

For this reason, a GaN cap layer is also removed in the hole extracting electrode formation region to form a recess.

Figure 9A:
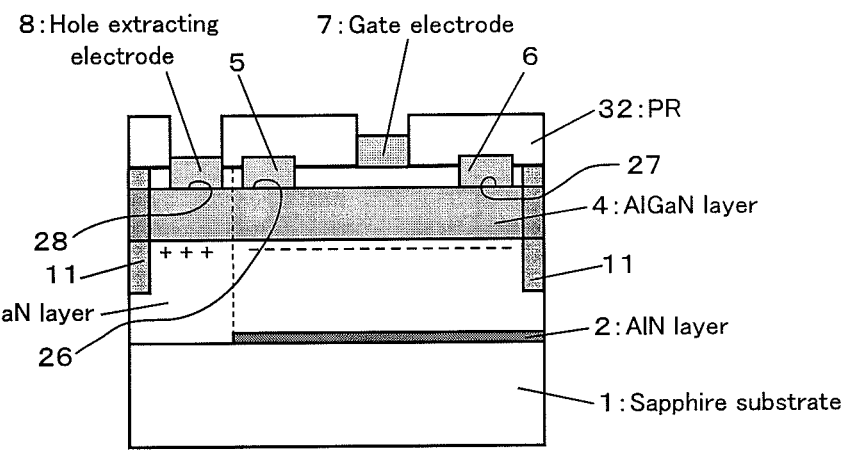
FIGS. 9A and 9B are schematic cross-sectional views illustrating the method for manufacturing the semiconductor device according to the third embodiment.
Figure 9B:
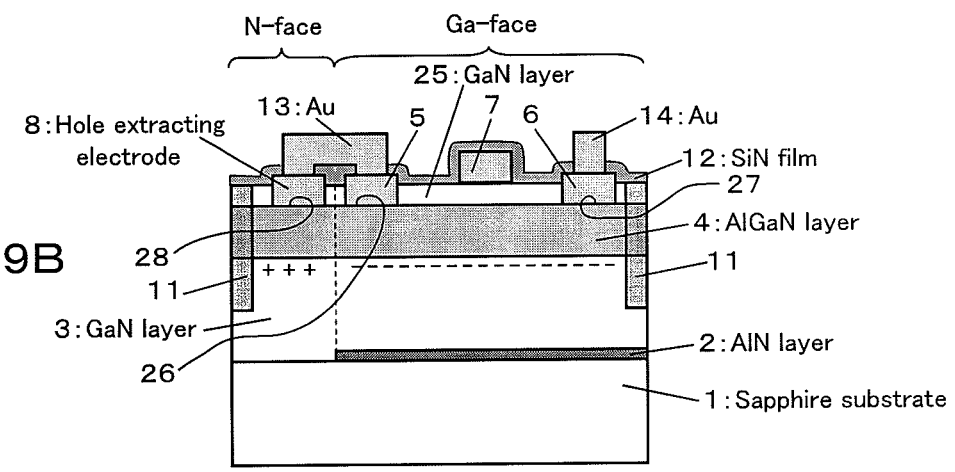

Thus, this embodiment is different from the above-described first embodiment (see FIG. 1) in that a GaN cap layer 25 is provided on the AlGaN layer (barrier layer) 4 and that recesses 26, 27, and 28 are formed in the source electrode formation region, the drain electrode formation region, and the hole extracting electrode formation region, respectively, as illustrated in FIG. 9B. The same elements in FIGS. 9A and 9B as in the above-described first embodiment (see FIG. 1, for example) are referenced by the like reference symbols.

This embodiment has a device structure including a substrate 1, an AlN nucleation layer 2, an GaN layer 3, an AlGaN layer 4, and a GaN cap layer 25 formed entirely on the AlGaN layer 5, as illustrated in FIG. 9B.

In this example, the GaN layer 3, the AlGaN layer 4, and the GaN cap layer 25 respectively have the (0001) face and the (000-1) face on the same plane. More specifically, the AlGaN layer 4 is a nitride semiconductor layer that is formed above the common substrate 1, and has the (0001) face and the (000-1) face (first nitride semiconductor layer; GaN-based semiconductor layer). The GaN layer 3 contacting the bottom of the AlGaN layer 4 is a nitride semiconductor layer that is formed above the common substrate 1, and has the (0001) face and the (000-1) face (the second nitride semiconductor layer; GaN-based semiconductor layer). The GaN cap layer 25 contacting the top of the AlGaN layer 4 is a nitride semiconductor layer that is formed above the common substrate 1, and has the (0001) face and the (000-1) face (third nitride semiconductor layer; GaN-based semiconductor layer).

A source electrode 5 and a drain electrode 6 is provided in a region (recesses, 26 27) partially thinned in the nitride semiconductor layer having the Ga-face, i.e., (0001) face. In this example, the GaN cap layer 25 having the Ga-face, i.e., (0001) face, is removed in the source electrode formation region and the drain electrode formation region, and the source electrode 5 and the drain electrode 6 are provided on the AlGaN layer 4 having the Ga-face, i.e., (0001) face.

In contrast, the gate electrode 7 is provided on the GaN cap layer 25 having the Ga-face, i.e., (0001) face.

A hole extracting electrode 8 is provided in a region (recess 28) partially thinned in a nitride semiconductor layer having an N-face, i.e., (000-1) face. In this example, the GaN cap layer 25 having the N-face, i.e., (000-1) face, is removed in the hole extracting electrode formation region, and the hole extracting electrode 8 is provided on the AlGaN layer 4 having the N-face, i.e., (000-1) face.

The details of other elements are similar to those in the above-described first embodiment, and descriptions thereof will be omitted.

Hereinafter, a method for manufacturing the semiconductor device according to this embodiment (GaN-HEMT) will be explained with reference to FIGS. 8A-8F, 9A, and 9B.

Figure 8A:
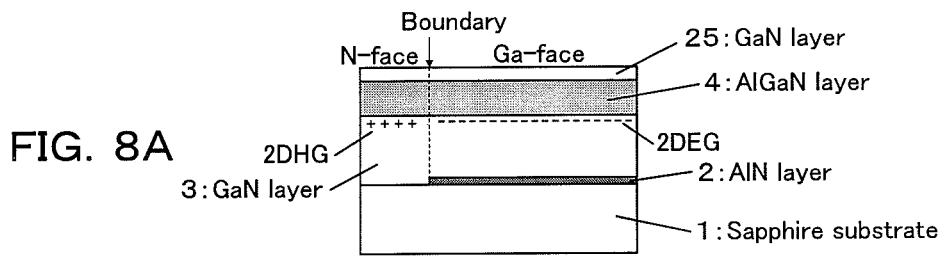
FIGS. 8A-8F are schematic cross-sectional views illustrating a method for manufacturing a semiconductor device according to a third embodiment.

The processes similar to those in the above-described first embodiment (see FIGS. 2A-2D) is carried out to fabricate a wafer having an AlN nucleation layer 2 partially on a C-face sapphire substrate 1. As illustrated in FIG. 8A, a GaN layer 3 (approximately 1 μm thick), an AlGaN layer 4 (approximately 25 nm thick) having an Al composition of about 20%, and a GaN cap layer are then sequentially grown above the wafer at a substrate temperature of approximately 720° C. by PAMBE, for example. This provides a GaN-HEMT crystal with the GaN cap layer. The same elements in FIGS. 8A-8F as in the above-described first embodiment (see FIG. 1, for example) are referenced by the like reference symbols.

In this case, in the regions directly grown on the C-face sapphire substrate 1, the GaN layer 3 having the N-face surface, the AlGaN layer 4 having the N-face surface, and the GaN cap layer 25 having the N-face surface are formed, while, in the region grown on the AlN nucleation layer 2, the GaN layer 3 having the Ga-face surface, the AlGaN layer 4 having the Ga-face surface, and the GaN cap layer 25 having the Ga-face surface are formed. That is, a nitride semiconductor layer (GaN layer 3, AlGaN layer 4, and GaN cap layer 25, in this embodiment) having the N-face and the Ga-face on the same plane are formed.

The thus prepared wafer is processed to fabricate devices.

Figure 8B:
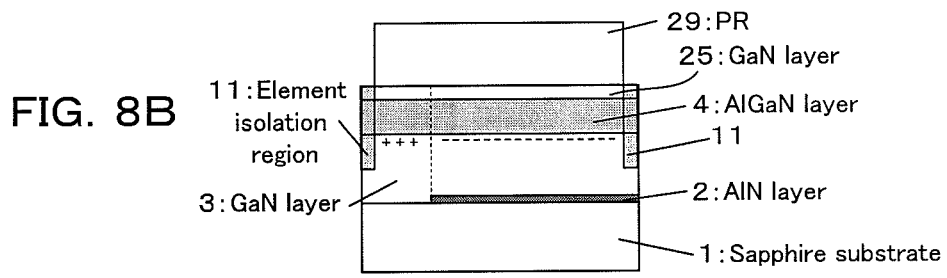

As illustrated in FIG. 8B, after a resist 29 is photolithographically patterned to cover the region other than the region in which an element isolation regions 11 are to be formed, i.e., the active region, ions, such as boron, are implanted to define element isolation regions 11. Note that the element isolation may also be achieved by forming a mesa structure by chlorine-based dry etching, for example.

Figure 8C:
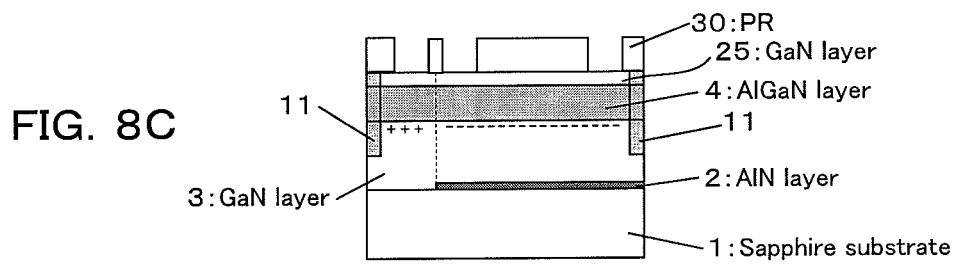

After removing the resist 29, as illustrated in FIG. 8C, a resist 30 is applied again and the resist on the source electrode formation region, the drain electrode formation region, and the hole extracting electrode formation region is opened by photolithography, for example.

Figure 8D:
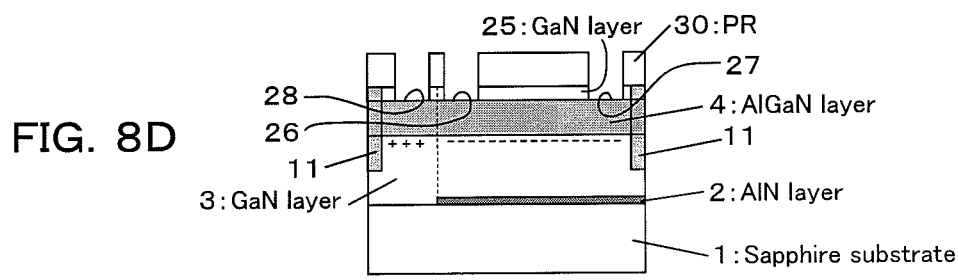

Subsequently, as illustrated in FIG. 8D, the GaN cap layer 25 in the source electrode formation region, the drain electrode formation region, and the hole extracting electrode formation region is simultaneously removed through the opening in the resist 30, by chlorine-based dry etching, for example. This results in formation of the recesses 26, 27, and 28 in the source electrode formation region, the drain electrode formation region, and the hole extracting electrode formation region.

Figure 8E:
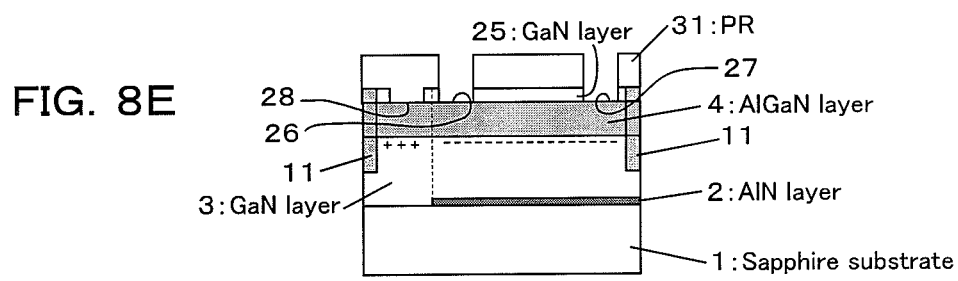

After removing the resist 30, as illustrated in FIG. 8E, a resist 31 is applied again and the resist in the source electrode formation region and the drain electrode formation region is opened by photolithography, for example.

Figure 8F:
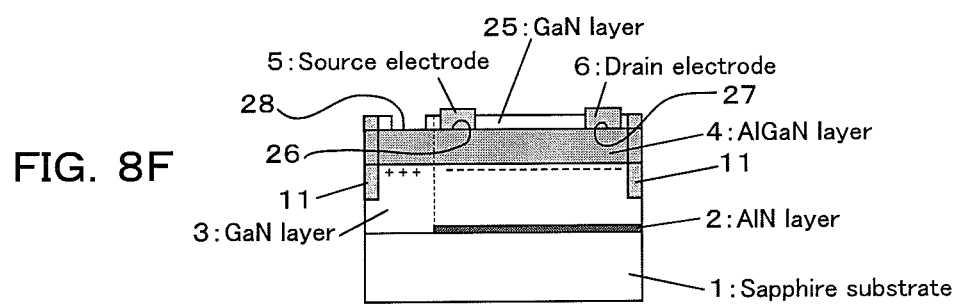

The source electrode 5 and the drain electrode 6, both made of Ti/Al, are then formed on the AlGaN layer 4 having the Ga-face by evaporation and lift-off, for example, as illustrated in FIG. 8F. A rapid thermal anneal (RTA) is carried out at approximately 600° C., for example, to establish an ohmic contact.

After removing the resist 31, a resist 32 is applied again. After photolithographic patterning, for example, as illustrated in FIG. 9A, a gate electrode 7 made of Ni/Au and a hole extracting electrode 8 made of Ni/Au are formed simultaneously on the GaN cap layer 25 having the Ga-face and on the AlGaN layer 4 having the N-face, respectively, by evaporation and lift-off.

Finally, a passivation is provided by an SiN layer (insulation layer) 12, which may be formed by plasma enhanced CVD or the like, for example, as illustrated in FIG. 9B. After removing a part of the SiN layer 12 in the contact regions by dry etching, the source electrode 5 and the hole extracting electrode 8 are connected through interconnection (source interconnection) 13 made of plated Au.

The semiconductor device according to this embodiment (GaN-HEMT) may be fabricated in the manner set forth above.

The details of other steps in the fabrication method are similar to those in the above-described first embodiment, and descriptions thereof will be omitted.

Thus, the semiconductor device and the method for manufacturing the same according to this embodiment provide advantages in that holes generated by impact ionization can be effectively extracted in a semiconductor device capable of operating at a high speed and a high voltage, without using any conductive buffer layer, without requiring any complex processes, without requiring any dry etching process with a significantly high depth precision, and without deteriorating the crystallinity.

Especially, since the hole extracting electrode 8 is formed on the N-face growing AlGaN barrier layer 4 in a GaN-HEMT having the GaN cap layer 25, as in the case of the above-described first embodiment, holes generated by impact ionization can be effectively extracted.

Since the recesses 26 and 27 in the source electrode formation region and the drain electrode formation region and the recess 28 in the hole extracting electrode formation region are simultaneously formed by etching, no additional process step is required.

Furthermore, systems employing a semiconductor device having the hole extracting electrode structure according to this embodiment, such as systems for wireless base stations, server systems, may be constructed as further reliable systems.

Although the source electrode 5, the drain electrode 6, and the hole extracting electrode 8 are provided on the surface of the AlGaN layer 4 and the gate electrode 7 is provided on the surface of the GaN cap layer 25 in the above-described embodiment, this is not limiting. For example, the source electrode 5, the drain electrode 6, and the hole extracting electrode 8 may be provided in regions partially thinning the AlGaN layer 4 (recesses). For example, the gate electrode 7 may also be provided in a region partially thinning in the GaN cap layer 25 (recess).

As in the variant of the above-described second embodiment (see FIG. 6), the region in which the hole extracting electrode is to be formed may be formed as a trench (etched trench) extending to a depth deeper than the AlGaN/GaN interface, e.g., to the interface with the sapphire substrate 1, and the hole extracting electrode may be formed in the trench, for example.

Although the above-described embodiment has been described as being applied to the variant of the first embodiment (see FIG. 1), this embodiment may be applied to the variant of the first embodiment (see FIG. 4).

[Fourth Embodiment]

A semiconductor device and a method for manufacturing the same, and an amplifier according to a fourth embodiment will be explained with reference to FIGS. 10A-10D.

This embodiment will be described with reference to an example wherein the present invention is applied to a GaN-HEMT having a via hole and a via interconnection.

For example, via interconnection is required in a millimeter wave GaN-HEMT monolithic microwave integrate circuit (MMIC) amplifier (high-frequency amplifier including a GaN-HEMT) so as to reduce the source inductance.

For this reason, this embodiment is different from the above-described first embodiment (see FIG. 1) in that the via hole and the via interconnection are provided.

Figure 10A:
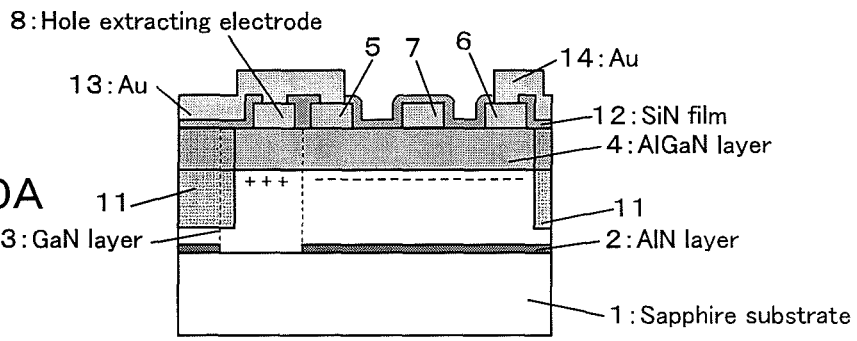
Figure 10B:
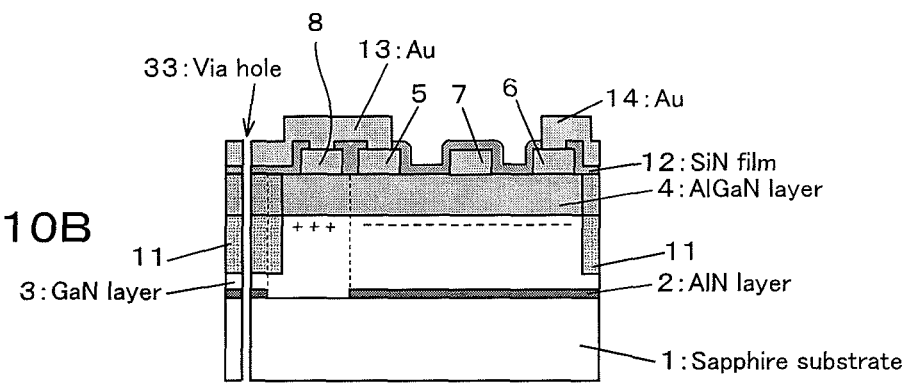
Figure 10C:
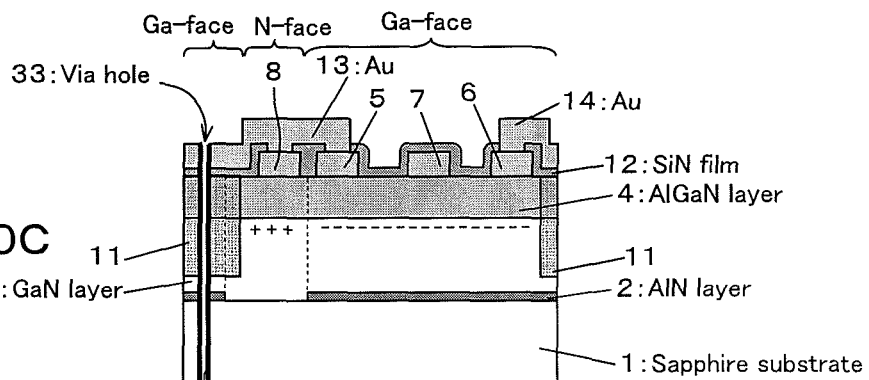
Figure 10D:
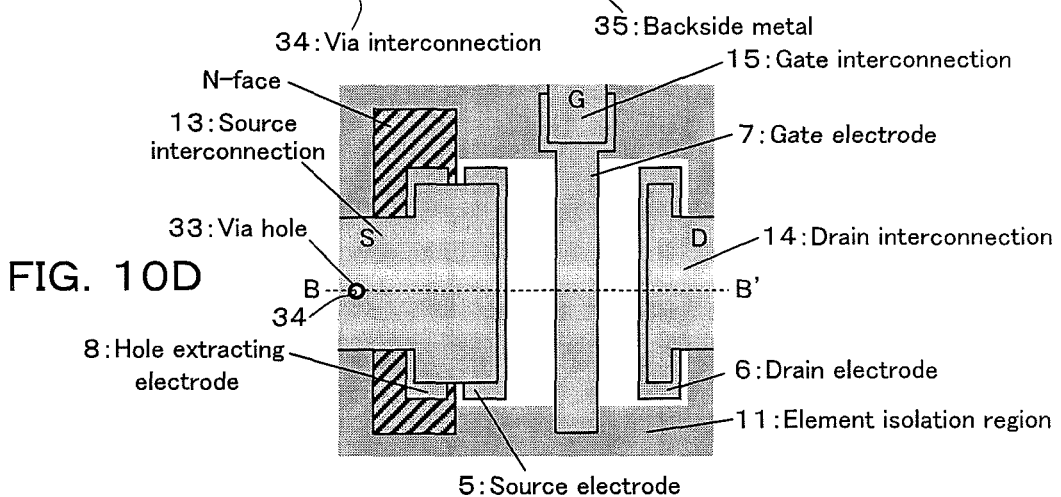

More specifically, in addition to the device structure of the above-described first embodiment, this semiconductor device further includes a via hole 33, a via interconnection 34 connected to a hole extracting electrode 8 and a backside metal 35 connected to the via interconnection 34, as illustrated in FIGS. 10C and 10D. The same elements in FIGS. 10A-10D as in the above-described first embodiment (see FIGS. 1 and 3A-3F, for example) are referenced by the like reference symbols.

In this example, the via hole 33 is formed in the region (inactive region; element isolation region 11) where a interconnection (pad) 13 electrically connected to the source electrode 5 and the hole extracting electrode 8 resides (inactive region; the element isolation region 11), and extends from the front surface side of the substrate, above which electrodes 5-8 are provided, to the back surface side. A via interconnection 34 formed in the via hole 33 is connected to the interconnection (pad) 13, which in turn is connected to the source electrode 5 and the hole extracting electrode 8, and is connected to the backside metal 35 formed on the back surface of the substrate.

Although the via hole 33 and the via interconnection 34 are formed in the nitride semiconductor layers 3 and 4 having the Ga-face in this embodiment, since the element isolation regions 11 are defined by ion-implanting boron or the like to the nitride semiconductor layers 3 and 4 having the Ga-face grown on the AlN nucleation layer 2, this is not limiting. For example, the element isolation region 11 may be defined by ion-implanting boron or the like to the nitride semiconductor layers 3 and 4 having the N-face grown in the region without the AlN nucleation layer 2, and the via hole 33 and the via interconnection 34 may be formed in a resultant element isolation region 11.

The details of other elements are similar to those in above-described first embodiment, and descriptions thereof will be omitted.

Hereinafter, a method for manufacturing the semiconductor device according to this embodiment (GaN-HEMT) will be explained with reference to FIGS. 10A-10D.

The processes similar to those in the above-described first embodiment (see FIGS. 2A-2F and 3A-3F) is carried out to fabricate a device as depicted in FIG. 10A.

Thereafter, as illustrated in FIG. 10B, a via is formed in the region (inactive region; element isolation region 11) where a interconnection (pad) 13 electrically connected to the source electrode 5 and the hole extracting electrode 8 resides.

Since the sapphire substrate 1 is quite rigid and highly resistant to chemicals, such as acids, the via hole 33 is formed using a high-power laser drill. In this case, the via hole 33 is a through via hole. That is, a via hole is formed which extends from the front surface side, above which electrodes 5-8 are provided, to the back surface side of the substrate.

Finally, as illustrated in FIGS. 10C and 10D, for example, Au electroplating is carried out subsequent to electroless Au plating or seed metal sputtering to form the via interconnection 34 and the backside metal 35. That is, the via interconnection 34 is formed which is connected to the interconnection (pad) 13, which in turn is connected to the source electrode 5 and the hole extracting electrode 8, and is connected to the backside metal 35 formed on the back surface of the substrate.

The details of other steps in the fabrication method are similar to those in the above-described first embodiment, and descriptions thereof will be omitted.

Thus, the semiconductor device and the method for manufacturing the same according to this embodiment provide advantages in that holes generated by impact ionization can be effectively drained in a semiconductor device capable of operating at a high speed and a high voltage, without using any conductive buffer layer, without requiring any complex processes, without requiring any dry etching process with a significantly high depth precision, and without deteriorating the crystallinity.

Especially, holes generated by impact ionization can be effectively extracted to the ground through the hole extracting electrode 8 connected to the via interconnection 34 and the backside metal 35. Furthermore, the source inductance can be reduced, thereby improving the high-frequency characteristics.

Furthermore, systems employing a semiconductor device having the hole extracting electrode structure according to this embodiment, such as millimeter-wave radar systems, may be constructed as further reliable systems.

In the meantime, for more effectively extracting holes, reduction in the distance between the via interconnection 34 and the hole extracting electrode 8 is considered to be effective.

In this case, provision of a via hole 33 is considered in the nitride semiconductor layer region having the N-face grow region, i.e., (000-1) face, wherein the hole extracting electrode 8 is provided.

Furthermore, upon the laser drilling for formation of a via hole, as in above-described embodiment, the crystal is ablated to form the via hole 33, and thus the nitride semiconductor layers 3 and 4 on the sidewall of the via hole 33 might be melted and damaged. This might result in damaging the N-face growing AlGaN/GaN hetero interface, thus hindering an effective hole extraction.

For the above reasons, a device structure of a variant of the above-described second embodiment (see FIG. 6), i.e., a device structure having a hole extracting electrode 8A extending to a depth deeper than the AlGaN/GaN interface, e.g., to the interface with the sapphire substrate 1, is used.

Figure 11A:
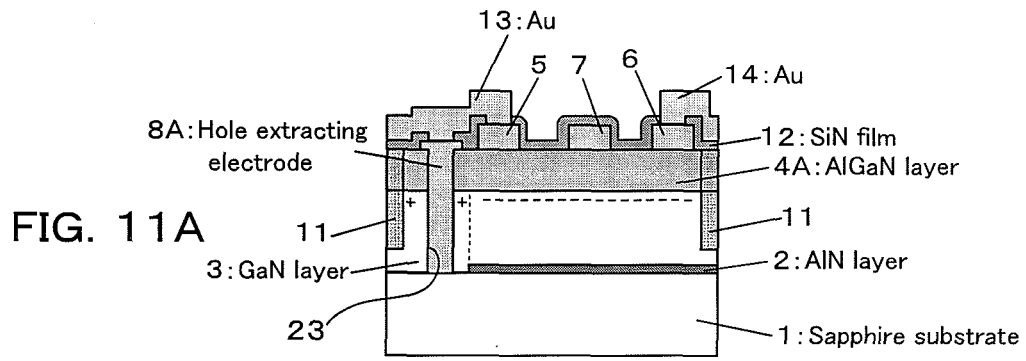
Figure 11B:
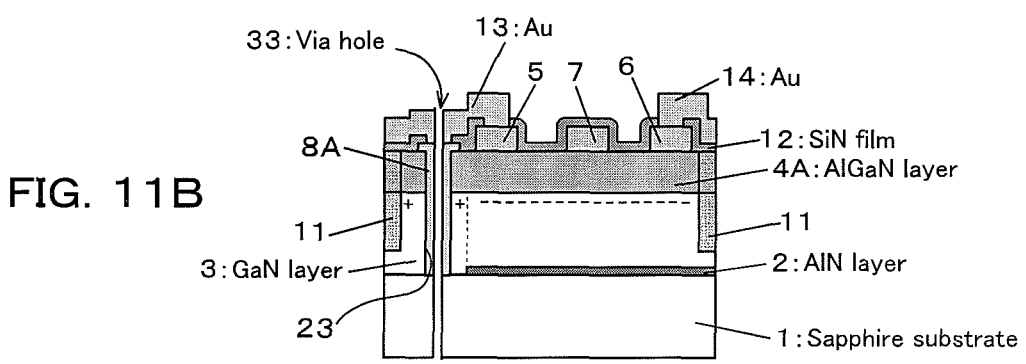

As illustrated in FIGS. 11A and 11B, the via hole 33 is formed at the center of the hole extracting electrode 8A by laser drill so as to pass through the hole extracting electrode 8A. More specifically, the via hole 33 is formed in the nitride semiconductor layer region having the N-face grow region, i.e., (000-1) face, and extends from the front surface side, above which electrodes 5-8 are provided, to the back surface side of the substrate. In this case, the nitride semiconductor crystal layers 3 and 4A (4) are protected, by the metal of the hole extracting electrode 8A, from any damages. The same elements in FIGS. 11A-11D as in the variant of the above-described second embodiment (see FIGS. 6 and 3F, for example) are referenced by the like reference symbols.

Figure 11C:
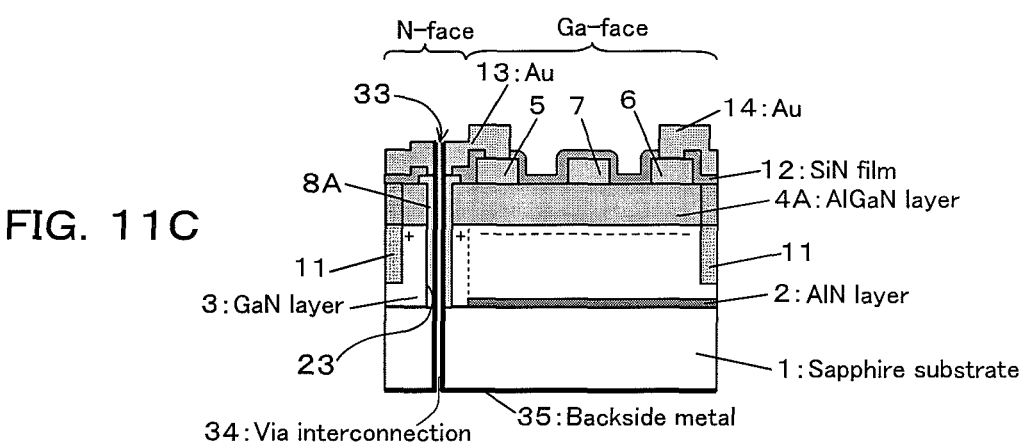
Figure 11D:
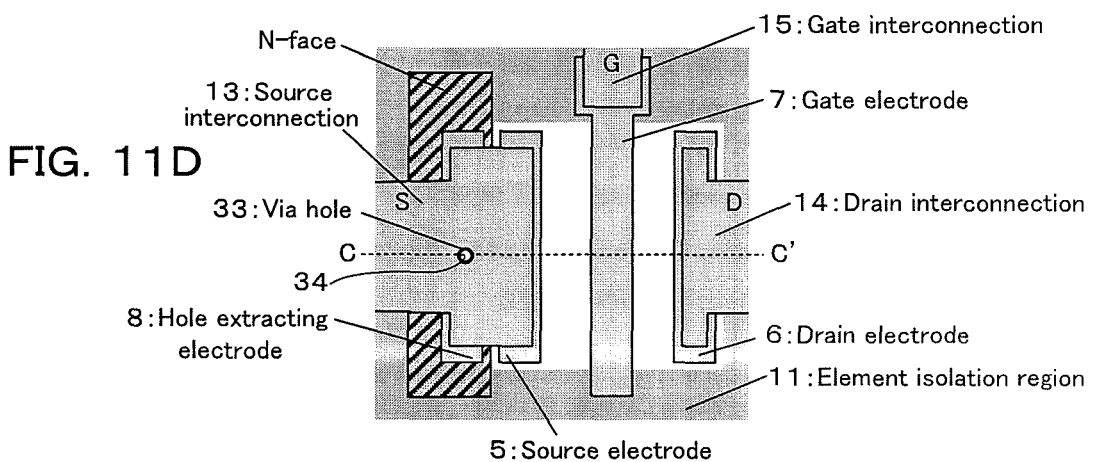

Finally, as illustrated in FIGS. 11C and 11D, for example, Au electroplating is carried out subsequent to electroless Au plating or seed metal sputtering to form the via interconnection 34 and the backside metal 35. The via interconnection 34 thus formed in the via hole 33 is connected to the hole extracting electrode 8A, and is connected to the backside metal 35 formed on the back surface of the substrate.

Since formation of the via hole 33 and the via interconnection 34 in this manner can reduce the distance between the hole extracting electrode 8A and the via interconnection 34, holes generated by impact ionization can be extracted more effectively.

In stead of opening via holes 33 one by one with laser drilling, via holes 33 may be formed by dry etching when an SiC substrate, a GaN substrate, or a AlN substrate is used.

This allows a large number of via holes to be formed simultaneously by dry etching, which helps to simplify the process. Furthermore, as compared to laser drilling, dry etching causes less damage, without melting of nitride semiconductor layer.

Figure 12:
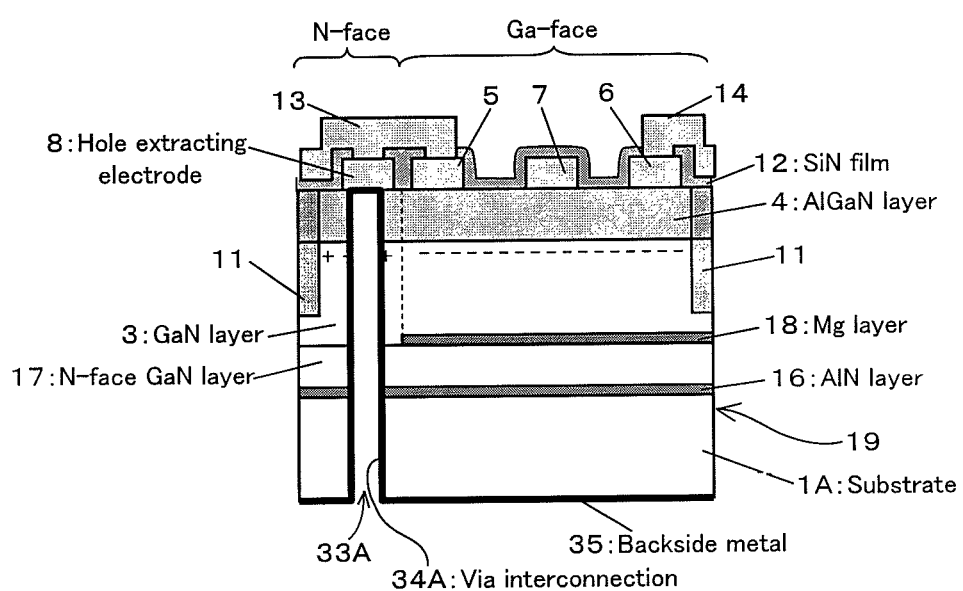
FIG. 12 is a schematic cross-sectional view illustrating the structure of a semiconductor device according to the variant of the forth embodiment.

Especially, in device structure as in the variant of the above-described first embodiment (see FIG. 4), via holes may be formed by dry etching, as illustrated in FIG. 12. For example, the substrate 1A and the nitride semiconductor layers 16, 17, 3, and 4 below the region, in which the hole extracting electrode 8 is formed, maybe removed by dry etching, and the via hole 33A may be formed extending from the back surface side of the substrate to the bottom of the hole extracting electrode 8. In this case, Ni/Au used in the hole extracting electrode 8 can function as an effective etch stopper.

The via interconnection 34A formed in the via hole 33A is connected to the hole extracting electrode 8, and is connected to the backside metal 35 formed on the back surface of the substrate. Especially, when the via interconnection 34A and the backside metal 35 are made as a Ni/Au structure by electroless plating or the like, holes can be extracted also from the sidewall of the N-face growing AlGaN/GaN interface. The manufacturing yield can be also improved. Although the via interconnection 34A and the backside metal 35 may include a Ti/Au structure, holes cannot be extracted from the sidewall of the N-face growing AlGaN/GaN interface in this case.

Figure 13:
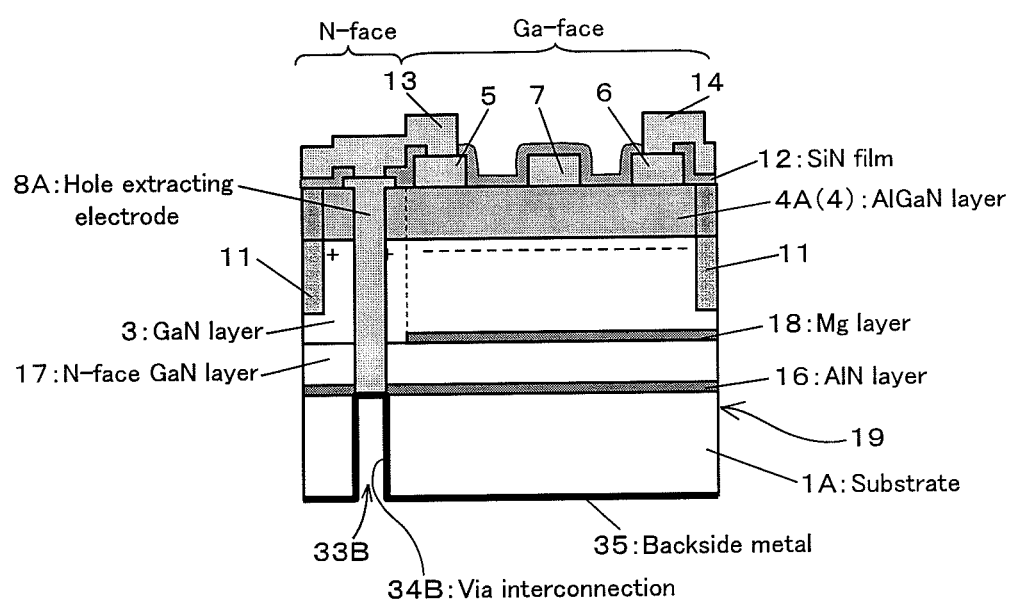
FIG. 13 is a schematic cross-sectional view illustrating the structure of a semiconductor device according to another variant of the forth embodiment.
Figure 14A:
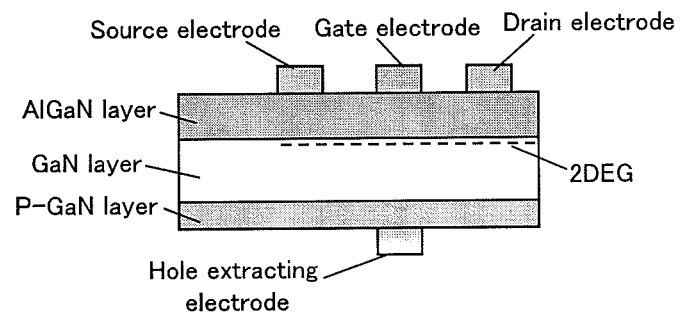
FIGS. 14A-14C are schematic cross-sectional views illustrating the structures of conventional semiconductor devices.
Figure 14B:
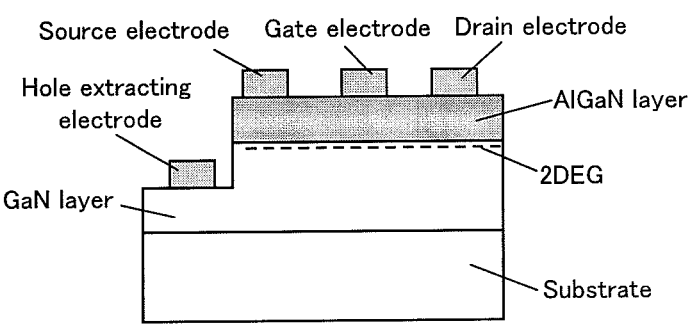
Figure 14C:
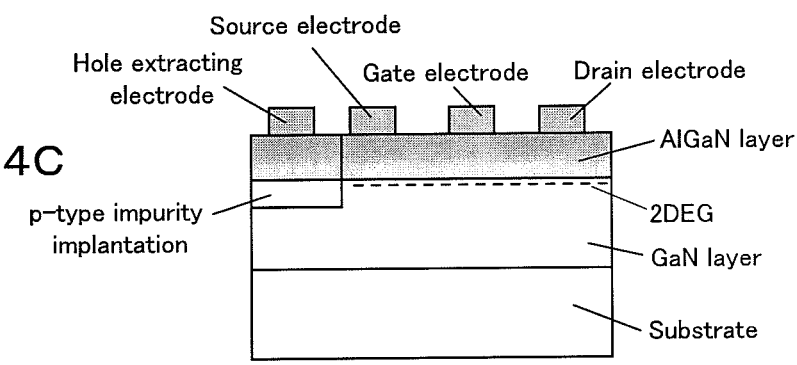

Furthermore, in device structure as in the variant of the above-described second embodiment (see FIGS. 6 and 4), via holes may be formed by dry etching, as illustrated in FIG. 13. For example, the substrate 1A below the region, in which the hole extracting electrode 8A is formed, may be removed by dry etching, and the via hole 33B may be formed extending from the bottom of the hole extracting electrode 8A to the back surface side of the substrate. The via interconnection 34B formed in the via hole 33B is connected to the hole extracting electrode 8A, and is connected to the backside metal 35 formed on the back surface of the substrate. In this case, since the hole extracting electrode 8A made of Ni/Au is provided to a position deeper than the N-face growing AlGaN/GaN interface, the hole extracting electrode 8A can function as an effective etch stopper and can effectively extract holes generated by impact ionization from the sidewall of the N-face growing AlGaN/GaN interface. In this case, since the hole extracting electrode 8A has the Ni/Au structure, the manufacturing yield is improved.

Especially, a faster etching can be achieved by chlorine-based dry etching when a GaN substrate or a AlN substrate is used. In contrast, when a SiC substrate is used, a faster etching can be achieved by using dry etching based on $SF_6/O_2$.

Although the source electrode 5, the drain electrode 6, the gate electrode 7, and the hole extracting electrode 8 are provided on the surface of the AlGaN layer 4 in the above-described embodiment, this is not limiting. For example, the hole extracting electrode 8 or the gate electrode 7 may be provided in a region partially thinned in the AlGaN layer 4A (4) (recess), as in the variant of the above-described second embodiment (see FIG. 7).

Although the above-described embodiment has been described as being applied to the variant of the first embodiment (see FIG. 1), this embodiment may be applied to the variant of the first embodiment (see FIG. 4).

[Others]

Note that the present invention is not limited to the configurations of the embodiments and the variants set forth above, and may be modified in various manners without departing from the sprit of the present invention.

For example, although the above-described embodiments and variants have been described with reference to the examples in which AlGaN and GaN are used as nitride semiconductor layers, this is not limiting. InGaN, InAlN, InAlGaN, or the like may be used and may provide similar advantageous effects.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present invention have been described in detail, it should be understood that the various changes, substitutions, and alterations could be made hereto without departing from the spirit and scope of the invention.

What is claimed is:

1. A semiconductor device comprising:
   a plurality of transistor regions formed over a common substrate and being isolated from each other by an isolation region;
   each of the plurality of transistor regions including:
      a nitride semiconductor layer having a (0001) face and a (000-1) face;
      a (0001) face forming layer provided partially between the substrate and the nitride semiconductor layer;
      a source electrode, a drain electrode, and a gate electrode, provided on the nitride semiconductor layer having the (0001) face; and
      a hole extracting electrode provided on the nitride semiconductor layer having the (000-1) face.

2. The semiconductor device according to claim 1, wherein the nitride semiconductor layer comprises a first nitride semiconductor layer having a (0001) face and a (000-1) face and a second nitride semiconductor layer contacting the bottom of the first nitride semiconductor layer and having a (0001) face and a (000-1) face,
   the source electrode, the drain electrode, and the gate electrode are provided on the first nitride semiconductor layer having the (0001) face,
   the hole extracting electrode is provided on the first nitride semiconductor layer having the (000-1) face.

3. The semiconductor device according to claim 2, wherein the hole extracting electrode extends from the surface of the first nitride semiconductor layer to a depth deeper than an interface between the first nitride semiconductor layer and the second nitride semiconductor layer.

4. The semiconductor device according to claim 1, wherein the nitride semiconductor layer comprises a first nitride semiconductor layer having a (0001) face and a (000-1) face and a third nitride semiconductor layer contacting the top of the first nitride semiconductor layer and having a (0001) face and a (000 -1) face,
   the source electrode and the drain electrode are provided on the first nitride semiconductor layer having the (0001) face,
   the hole extracting electrode is provided on the first nitride semiconductor layer having the (000-1) face,
   the gate electrode is provided on the third nitride semiconductor layer having the (0001) face.

5. The semiconductor device according to claim 1, further comprising:
   a via hole; and
   a via interconnection provided in the via hole and connected to the hole extracting electrode.

6. The semiconductor device according to claim 1, further comprising:

a via hole; and a via interconnection provided in the via hole and connected to the hole extracting electrode, wherein the hole extracting electrode extends from the surface of the first nitride semiconductor layer to a depth deeper than an interface between the first nitride semiconductor layer and the second nitride semiconductor layer, and the via hole is formed through the hole extracting electrode so as to extend from the front surface side of the first nitride semiconductor layer to the back surface side of the substrate.

7. The semiconductor device according to claim 1, wherein the substrate is a substrate selected from the group consisting of a sapphire substrate, a silicon carbide substrate, a gallium nitride substrate, and an aluminum nitride substrate.

8. The semiconductor device according to claim 1, wherein the substrate is a C-face sapphire substrate, and the (0001) face forming layer is an AlN layer.

9. The semiconductor device according to claim 1, further comprising a fourth nitride semiconductor layer formed entirely above the substrate and having a (000-1) face, wherein the (0001) face forming layer is a Mg layer formed partially on the fourth nitride semiconductor layer.

10. The semiconductor device according to claim 1, the hole extracting electrode is formed from a metal having a work function of 5 eV or greater.

11. The semiconductor device according to claim 1, wherein the gate electrode and the hole extracting electrode are made from the same material.

12. The semiconductor device according to claim 1, the nitride semiconductor layer is an AlGaN layer having an aluminum composition of 25% or higher.

13. The semiconductor device according to claim 1, wherein the hole extracting electrode is formed in a recess provided on the nitride semiconductor layer having the (000-1) face.

14. The semiconductor device according to claim 1, wherein the gate electrode is formed in a recess provided on the nitride semiconductor layer having the (0001) face.

15. An amplifier comprising:

a semiconductor device including:

a plurality of transistor regions formed over a common substrate and being isolated from each other by an isolation region;

each of the plurality of transistor regions including:

a nitride semiconductor layer having a (0001) face and a (000-1) face;

a (0001) face forming layer provided partially between the substrate and the nitride semiconductor layer;

a source electrode, a drain electrode, and a gate electrode, provided on the nitride semiconductor layer having the (0001) face; and a hole extracting electrode provided on the nitride semiconductor layer having the (000-1) face.

16. A method for manufacturing a semiconductor device, comprising:

forming a (0001) face forming layer partially above a substrate;

forming a nitride semiconductor layer having a (0001) face and a (000-1) face, above the substrate and the (0001) face forming layer;

forming a source electrode, a drain electrode, and a gate electrode, on the nitride semiconductor layer having the (0001) face, and forming a hole extracting electrode on the nitride semiconductor layer having the (000-1) face; and forming an isolation region such that a plurality of transistor regions are formed, each of the plurality of transistor regions including the nitride semiconductor layer having the (0001) face and the (000-1) face.

17. The method for forming a semiconductor device according to claim 16, wherein the substrate is a C-face sapphire substrate, and the (0001) face forming layer is an AlN layer.

18. The method for forming a semiconductor device according to claim 16, further comprising:

forming another nitride semiconductor layer having a (000-1) face entirely above the substrate; and forming partially, on the another nitride semiconductor layer, a Mg layer as the (0001) face forming layer.

19. The method for forming a semiconductor device according to claim 16, further comprising:

forming the source electrode and the drain electrode simultaneously on the nitride semiconductor layer having the (0001) face; and forming the gate electrode on the nitride semiconductor layer having the (0001) face, and the hole extracting electrode on the nitride semiconductor layer having the (000-1) face, simultaneously, from a metal having a work function of 5 eV or greater.

* * * * *